United States Patent [19]

Shiomi et al.

[11] Patent Number: 5,225,717
[45] Date of Patent: Jul. 6, 1993

[54] BICMOS INPUT BUFFER CIRCUIT OPERABLE AT HIGH SPEED UNDER LESS POWER CONSUMPTION

[75] Inventors: Toru Shiomi; Jun Takahashi, both of Hyogo, Japan

[73] Assignee: Mitsubishi Denki Kabushiki Kaisha, Tokyo, Japan

[21] Appl. No.: 802,682

[22] Filed: Dec. 5, 1991

[30] Foreign Application Priority Data

May 9, 1991 [JP] Japan ................ 3-104099

[51] Int. Cl.⁵ ........................ H03K 19/02; H03K 19/20
[52] U.S. Cl. ........................ 307/446; 307/455; 307/570; 307/443
[58] Field of Search ........... 307/455, 456, 446, 570, 307/443

[56] References Cited

U.S. PATENT DOCUMENTS

| | | | |
|---|---|---|---|
| 4,813,020 | 3/1989 | Iwamura et al. | 307/570 |
| 4,868,421 | 9/1989 | Herndon et al. | 307/455 |
| 5,065,050 | 11/1991 | Fernandez | 307/455 |
| 5,140,190 | 8/1992 | You et al. | 307/570 |

FOREIGN PATENT DOCUMENTS 62-5723 1/1988 Japan .

OTHER PUBLICATIONS

"An 8 ns 256K BiCMOS RAM" (1988 IEEE International Solid State Circuits Conference, Digest of Technical Papers, pp. 184-185).

Primary Examiner—Edward P. Westin
Assistant Examiner—Andrew Sanders
Attorney, Agent, or Firm—Lowe, Price, LeBlanc & Becker

[57] ABSTRACT

An input buffer circuit applicable as a BiCMOS RAM address buffer is disclosed. An improved level shift circuit 59 includes PMOS transistors 14 and 17 for bypassing emitter follower transistors 12 and 15, and NMOS transistors 13 and 16 for constituting a controllable current source Two differential amplifier circuits operating in response to an input signal having an ECL logic amplitude are provided, and emitter follower transistors 12 and 15 are driven by one of them, MOS transistors 13, 14, 16, and 17 are driven by the other. High operating speed is achieved under less current consumption, since emitter follower transistors 12 and 15, and MOS transistors 13, 14, 16, and 17 are driven, respectively.

3 Claims, 8 Drawing Sheets

BICMOS INPUT BUFFER CIRCUIT OPERABLE AT HIGH SPEED UNDER LESS POWER CONSUMPTION

BACKGROUND OF THE INVENTION

1. Field of the Invention

The present invention relates generally to input buffer circuits for semiconductor integrated circuit devices, and more particularly, to an input buffer circuit which comprises a level shift circuit using a bipolar transistor. The present invention has particular applicability to address input buffer circuits in a BiCMOS RAM.

2. Description of the Background Art

Generally, a circuit comprising bipolar transistors takes a large current, but it can achieve high speed operation and large load driving capability. The circuit comprising a CMOS transistor cannot operate as fast as the bipolar transistor circuit, but it can operate under less current consumption, and a high integration density level can be attained. Accordingly, a BiCMOS integrated circuit device comprises the bipolar transistor and the CMOS transistor formed on a single semiconductor substrate to make full use of the advantage of the bipolar transistor circuit and the CMOS transistor circuit.

The BiCMOS integrated circuit device receives an externally applied input signal having an amplitude following an emitter coupled logic (referred to as "ECL" hereinafter) and comprises an input circuit for driving the internal CMOS transistor circuit. In the following description, a BiCMOS RAM will be described as one example of the BiCMOS integrated circuit device to which the present invention can be preferably applied. For example, the BiCMOS RAM is often use in a secondary cache memory of a general purpose large computer, a main memory of a super computer, and a cache memory of an engineering work station (EWS) order to utilize, for example, the advantage of high speed operation.

FIG. 5 is a block diagram of a BiCMOS RAM known in general. Referring to FIG. 5, the BiCMOS RAM 70 comprises a memory cell array 79 including a number of memory cells constructed by MOS transistors. A row address buffer 71 receives row address signals RAO to RAm having an ECL logic amplitude to drive a row decoder 72 comprising MOS transistors. Similarly, a column address buffer 73 receives column address signals CAO to CAn having the ECL logic amplitude to drive a column decoder 74 comprising MOS transistors. A sense amplifier 75 amplifies a data signal read out from the memory cell array 79. The BiCMOS RAM 70 further comprises a read/write control circuit 77 for receiving input data Din, a chip selecting signal/CS, and a write enable signal/WE and for controlling read/write operation, an output buffer 76 for providing read out data Do, and a $V_{BB}$ generator 78 generating a reference potential $V_{BB}$. It should be noted that the row address buffer 71 and the column address buffer 73 drive the row decoder 72 and the column decoder 74 comprising MOS transistors in response to the externally applied address signal having the ECL logic amplitude. In other words, it should be noted that the row address buffer 71 and the column address buffer 73 convert the input signal having the externally applied ECL logic amplitude to the signal having the MOS logic amplitude.

FIG. 6 is a circuit diagram of a conventional input buffer circuit. The input buffer circuit is applicable in a row address buffer 71 or in a column address buffer 73 shown in FIG. 5. Referring to FIG. 6, the input buffer circuit comprises a first step level shift circuit 50 receiving an input signal Vin, a differential amplifier circuit 51, a level shift circuit 52, current mirror circuits 53 and 54 for level conversion, and driver circuits 55 and 56. An npn transistor 1 has base connected to receive the input signal Vin having an ECL logic amplitude. The transistor 1 has the collector connected to ground potential Vcc and the emitter connected to a negative power supply potential $V_{EE}$ through a constant current source 2. In the ECL logic, the input signal Vin has $-0.9$ V at a "H" level and has $-1.7$ V at a "L" level. Generally, the negative power supply potential $V_{EE}$ is set to $-4.5$ V or $-5.2$ V.

The differential amplifier circuit 51 comprises npn transistors 6 and 9, resistors 5 and 8, and a constant current source 7. The transistor 6 has the collector connected to ground potential Vcc through the resistor 5. The transistor 9 has the collector connected to ground potential Vcc through the resistor 8. The emitters of the transistors 6 and 9 are connected together to the constant current source 7. The transistor 6 has the base connected to receive the input signal level shifted by the first step level shift circuit 50. The transistor 9 has the base connected to receive the reference potential $V_{BB}$. The reference potential $V_{BB}$ is generated from the $V_{BB}$ generator 78 shown in FIG. 5. The reference potential $V_{BB}$ is set to an intermediate value between a low level and a high level of the signal applied to the base of the transistor 6.

The level shift circuit 52 comprises an npn transistor 12 nd a constant current source 79, and an npn transistor 15 and a constant current source 81, each connected in series between ground potential Vcc and the power supply potential $V_{EE}$. Transistors 12 and 15 have their bases connected respectively to receive the output signal provided from the differential amplifier circuit 51. Level shifted signals /Va and Va are provided through the emitters of transistors 12 and 15, respectively.

Current mirror circuits 53 and 54 convert applied signals Va and /Va having the ECL logic amplitude to the signals Vb and /Vb having the CMOS logic amplitude, respectively. The current mirror circuit 53 comprises PMOS transistors 18 and 20, and NMOS transistors 19 and 21. Transistors 18 and 19 are connected in series between ground potential Vcc and the power supply potential $V_{EE}$. Transistors 20 and 21 are connected in series between ground potential Vcc and the power supply potential $V_{EE}$. Transistors 19 and 21 have their gates connected together to a common connection node of the transistors 18 and 19. The transistor 18 has the gate connected to receive the level shifted signal /Va. The transistor 20 has the gate connected to receive the level shifted signal Va. The current mirror circuit 54 comprises PMOS transistors 22 and 24, and NMOS transistors 23 and 25, and it has the same circuit construction as the current mirror circuit 53. The current mirror circuit 53 provides the level converted signal /Vb through the common connection node of the transistors 20 and 21. Similarly, the current mirror circuit 54 provides the level converted signal Vb through the common connection node of the transistors 24 and 25.

The driver circuit 55 comprises npn transistors 30 and 31 connected in series between ground potential Vcc and the power supply potential $V_{EE}$, a PMOS transistor 26 and an NMOS transistor 27 constituting an inverter for controlling the base of the transistor 30, and NMOS transistors 28 and 29 for controlling the base of the transistor 31. The gate of each of the transistors 26, 27, and 28 receives the signal /Vb. Through the common connection node of the emitter of the transistor 30 and the collector of the transistor 31, the output signal Vo is provided to drive the next stage MOS transistor circuit, not shown. The driver circuit 56 has the same circuit construction as the driver circuit 55. That is, the driver circuit 56 comprises npn transistors 36 and 37, a PMOS transistor 32 and an NMOS transistor 33 for controlling the base of the transistor 36, and NMOS transistors 34 and 35 for controlling the base of the transistor 37. The gate of each of the transistors 32, 33, and 34 receives the level shifted signal Vb. Through the common connection node of the transistors 36 and 37, the signal /Vo is provided to drive the circuit connected to next stage.

The operation will be described. When the input signal Vin having the ECL logic amplitude turns from a low level to a high level, the base potential of the transistor 6 also turns from a low level to a high level. Then, the transistor 6 turns on, while the transistor 9 turns off. By the turning on of the transistor 6, the base potential of the transistor 12 attains a low level determined by $(V_{cc}-R_5 \cdot I_7)$, where, $R_5$ represents resistance value of the resistor 5, and $I_7$ represents current value of the constant current source 7. In addition, by the turning off of the transistor 9, the base potential of the transistor 15 attains a high level almost as high as ground potential Vcc. Accordingly, the signal /Va representing the emitter potential of the transistor 12 attains a low level determined by the potential $(V_{cc}-R_5 \cdot I_7 - V_{BE12})$. The signal Va representing the emitter potential of the transistor 15 attains a high level determined by $(V_{cc} - V_{BE15})$, where, $V_{BE12}$ and $V_{BE15}$ represent the base to emitter voltage of transistors 12 and 15.

In the current mirror circuits 53 and 54, transistors 18 and 24 turn on in response to a low level signal /Va, and transistors 20 and 22 turn off in response to a high level signal Va. Therefore, the output signal /Vb of the current mirror circuit 53 turns from a high level (Vcc) to a low level ($V_{EE}$), and the output signal Vb of the current mirror circuit 54 turns from a low level ($V_{EE}$) to a high level (Vcc). These output signals Vb and /Vb have the CMOS logic amplitude. In other words, signals Va and /Va are converted to signals Vb and /Vb having the CMOS logic amplitude in response to the input signal Vin having the ECL logic amplitude.

Current mirror circuits 53 and 54 do not have large load driving capability since they are formed of CMOS transistors. For the purpose of increasing load driving capability, BiCMOS driver circuits 55 and 56 are provided for amplifying the current. When the signal Vb changes from a high level (Vcc) to a low level ($V_{EE}$), the transistor 26 turns on, and transistors 27 and 28 turn off. Accordingly, since the transistor 29 turns on, npn transistors 30 and 31 turn on and off, respectively. As a result, a high level output signal Vo is provided. At the same time, since the signal Vb changes from a low level to a high level, the transistor 32 turns off, and transistors 33 and 34 turn on. Accordingly, the transistor 35 turns off, and npn transistors 36 and 37 turn on and off, respectively. As a result, a low level output signal /Vo is provided.

When the input signal Vin having the ECL logic amplitude changes from a high level to a low level, the transistor 6 turns off, and the transistor 9 turns on. The base potential of the transistor 12 attains a high level almost as high as ground potential Vcc, and the base potential of the transistor 15 attains a low level determined by $(V_{cc}-R_8 \cdot I_7)$. Accordingly, the signal /Va attains a high level determined by $(V_{cc}-V_{BE12})$, and the signal Va attains a low level determined by $(V_{cc}-R_8 \cdot I_7 - V_{BE15})$, where, $R_8$ represents resistance value of the resistor 8. Current mirror circuits 53 and 54, and driver circuits 55 and 56 receive signals Va and /Va, and operate in the same manner as the foregoing. Therefore, the description of the operation is not repeated.

FIG. 7 is a circuit diagram showing another example of a conventional input buffer circuit. The input buffer circuit is disclosed in an article "An 8 ns 256K BiCMOS RAM" (1988 IEEE International Solid-State Circuits Conference, Digest of Technical Papers pp. 184–185). When compared with the circuit shown in FIG. 6, the input buffer circuit shown in FIG. 7 comprises NMOS transistors 90 and 92 as controllable current sources in place of constant current sources 79 and 81. Namely, an improved level shift circuit 57 comprises the npn transistor 12 and the NMOS transistor 90, and the npn transistor 15 and the NMOS transistor 92, each serially connected between ground potential Vcc and the power supply potential $V_{EE}$. The gate of the transistor 90 and the base of the transistor 15 are connected together to the collector of the transistor 9. The gate of the transistor 92 and the base of the transistor 12 are connected together to the collector of the transistor 6. Because other circuit construction of the input buffer circuit shown in FIG. 7 are similar to the one shown in FIG. 6, the description is not repeated. Furthermore, since the input buffer circuit shown in FIG. 7 operates basically in the same manner with the one shown in FIG. 6, the description is not repeated.

The problem in the input buffer circuit shown in FIG. 6 will be described. Since constant current sources 79 and 81 are connected to emitter of each of the transistors 12 and 15 constituting emitter followers, a certain constant current always flows through constant current sources 79 and 81. This implies that the current consumption is increased. In addition, since the level shift circuit 52 comprises emitter follower of transistors 12 and 15, output signals /Va and Va are decreased by the voltage $V_{BE12}$ and $V_{BE15}$. PMOS transistors 18, 20, 22, and 24 within current mirror circuits 53 and 54 operate in response to decreased signals/Va and Va. That is, PMOS transistors 18, 20, 22 and 24 are brought slightly to an on state because they receive signals/Va and Va decreased by the voltage $V_{BE}$. Thus, a current flows between ground potential Vcc and the power supply potential $V_{EE}$, and current consumption is further increased.

For the purpose of decreasing power consumption of the current flowing through constant current sources 79 and 81 shown in FIG. 6, NMOS transistors 90 and 92 shown in FIG. 7 work effectively. For example, when the input signal Vin changes from a low level to a high level, a collector potential of the transistor 6 turns from a high level to a low level. Since the gate of the NMOS transistor 92 as a current source is brought to a low level, the penetrating current flowing through the transistor 92 is decreased. Even when the input signal Vin changes from a high level to a low level, the penetrating current flowing through the transistor 90 is decreased because the gate of the transistor is brought to a low level. As a result, it becomes possible to decrease undesirable power consumption by constant current sources 79 and 81 shown in FIG. 6.

The input buffer circuit shown in FIG. 7 contributes to the decrease of power consumption as mentioned above: however, a new problem described hereinafter is caused. That is, transistors 90 and 92 shown in FIG. 7 have their gates connected to the base of npn transistors 15 and 12, respectively. In other words, the gate capacitances of transistors 90 and 92 are added to the gate of transistors 15 and 12, respectively. As a result, rise time and fall time of output signals Va and /Va provided from the level shift circuit 57 is increased. Transistors 90 and 92 prevent the level shift circuit 57 from achieving high speed operation. Even in the input buffer circuit shown in FIG. 7, it is pointed out that the increase of the power consumption cannot be prevented when the voltage $V_{BE}$ of signals Va and /Va is decreased.

FIG. 8 is a waveform diagram of the transition state of signals Va and /Va shown in FIG. 7. When an input signal Vin changes from a low level to a high level, two output signals Va and /Va of a level shift circuit 57 change in the way as shown in a dotted line in FIG. 8. Namely, since the gate capacitances of transistors 92 and 90 is added to the base of the npn transistors 12 and 15, respectively, undesirable time is required for signals Va and /Va to rise or fall. Furthermore, it is clear that the potential of the risen output signal Va attains the level lower than ground potential Vcc by the base to emitter voltage $V_{BE}$.

SUMMARY OF THE INVENTION

One object of the invention is to decrease [power consumption in an input buffer circuit.

Another object of the invention is to achieve high operating speed of an input buffer circuit under less power consumption.

Another object of the invention is to operate an input buffer circuit in a BiCMOS integrated circuit device at high speed under less power consumption.

Still another object is to operate an address buffer in a BiCMOS RAM at high speed under less power consumption.

In short, an input buffer circuit in accordance with the present invention includes a differential amplifier operated in response to an applied input signal and a predetermined reference potential, and an emitter follower level shift circuit for level shifting an output signal provided from the differential amplifier. The emitter follower level shift circuit includes a bipolar transistor and a controllable current source connected in series between a first and second power supply potentials. The bipolar transistor has the base connected to receive the output signal provided from the differential amplifier. The controllable current source is operated in response to the output signal provided from the differential amplifier. The emitter follower level shift circuit further includes a bypass circuit for bypassing the bipolar transistor in response to the output signal provided from the differential amplifier.

In operation, since the bypass circuit bypasses the bipolar transistor in response to the output signal provided from the differential amplifier, voltage drop by the base to emitter voltage of the bipolar transistor is prevented. Therefore, in the circuit connected to the next stage, possible increase of current consumption derived from voltage drop because of the base to emitter voltage can be prevented.

In accordance with another aspect of the invention, an input buffer circuit includes first and second differential amplifiers, each operating in response to an applied input signal and a predetermined reference potential, and an emitter follower level shift circuit for level shifting an output signal provided from the first differential amplifier. The emitter follower level shift circuit includes a bipolar transistor and a controllable current source connected in series between first and second power supply potentials. The bipolar transistor has the base connected to receive the output signal provided from the first differential amplifier. The controllable current source is operated in response to the output signal provided from the second differential amplifier.

In operation, the second differential amplifier is additionally provided, and the controllable current source is operated in response to the output signal provided from the second differential amplifier. The bipolar transistor including the emitter follower level shift circuit is operated in response to the output signal provided from the first differential amplifier, and it is not affected by the controllable current source. Accordingly, high speed operation of the bipolar transistor is not disturbed by the controllable current source.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
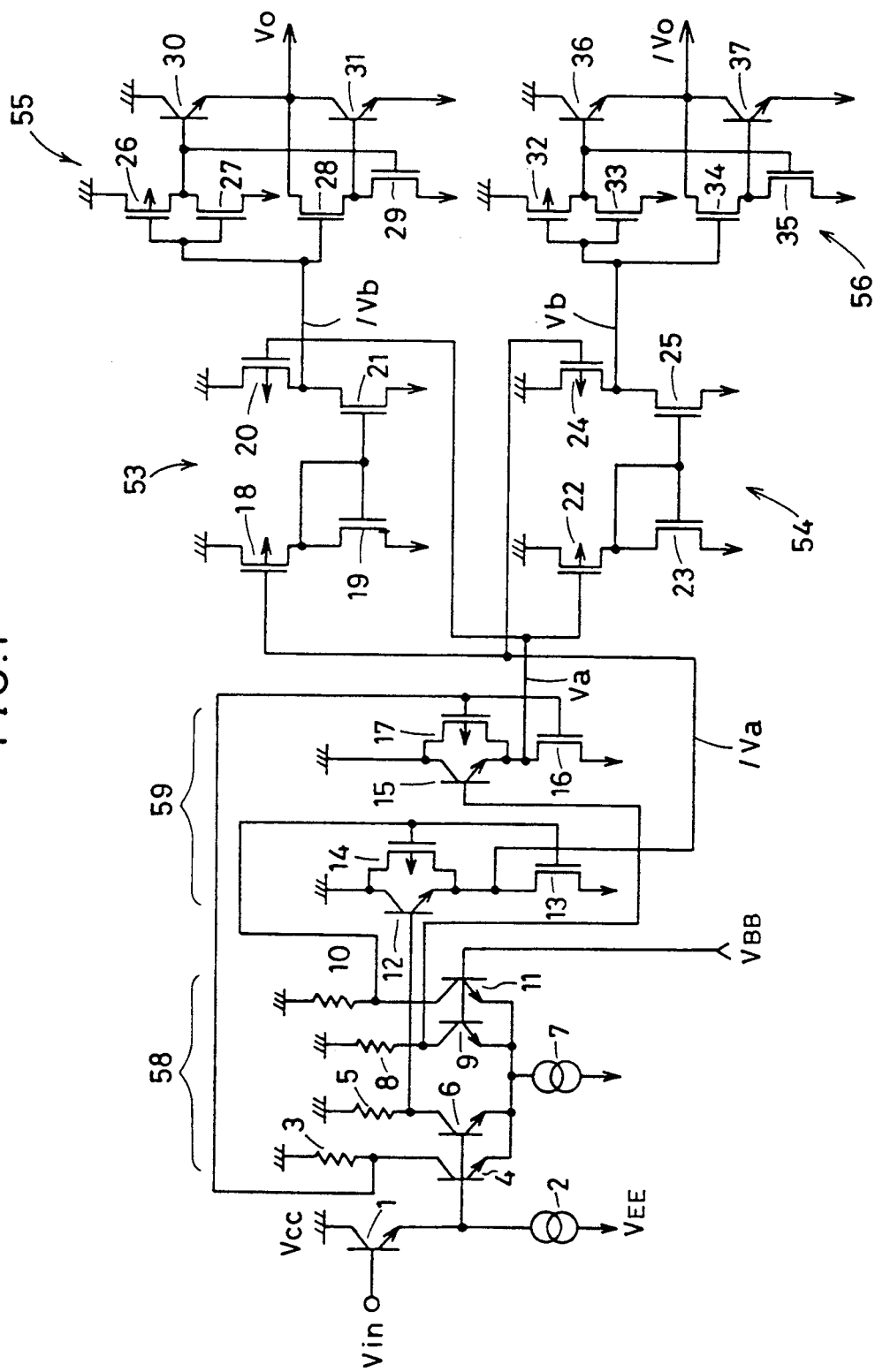
FIG. 1 is a circuit diagram of an input buffer circuit showing one embodiment of the present invention.

FIG. 1 is a circuit diagram of an input buffer circuit showing one embodiment of the present invention. The input buffer circuit shown in FIG. 1 is applicable not only to address buffers 71 and 73 within a BiCMOS RAM 70 shown in FIG. 5, but generally to a BiCMOS integrated circuit. When compared with the conventional one shown in FIG. 7, a second differential amplifier circuit comprising npn transistors 4 and 11, resistors 3 and 10, and a constant current source 7 is added to the input buffer circuit shown in FIG. 1. That is, an improved differential amplifier circuit 58 comprises the second differential amplifier circuit, in addition to the conventionally provided first differential amplifier circuit (comprising npn transistors 6 and 9, resistors 5 and 8, and the constant current source 7). Moreover, the input buffer circuit shown in FIG. 1 comprises an improved level shift circuit 59. That is, the level shift circuit 59 comprises npn transistors 14 and 17 for bypassing npn transistors 12 and 15, respectively. NMOS transistors 13 and 16 functioning as controllable current sources are operated in response to an output signal from the second differential amplifier circuit.

Figure 6:
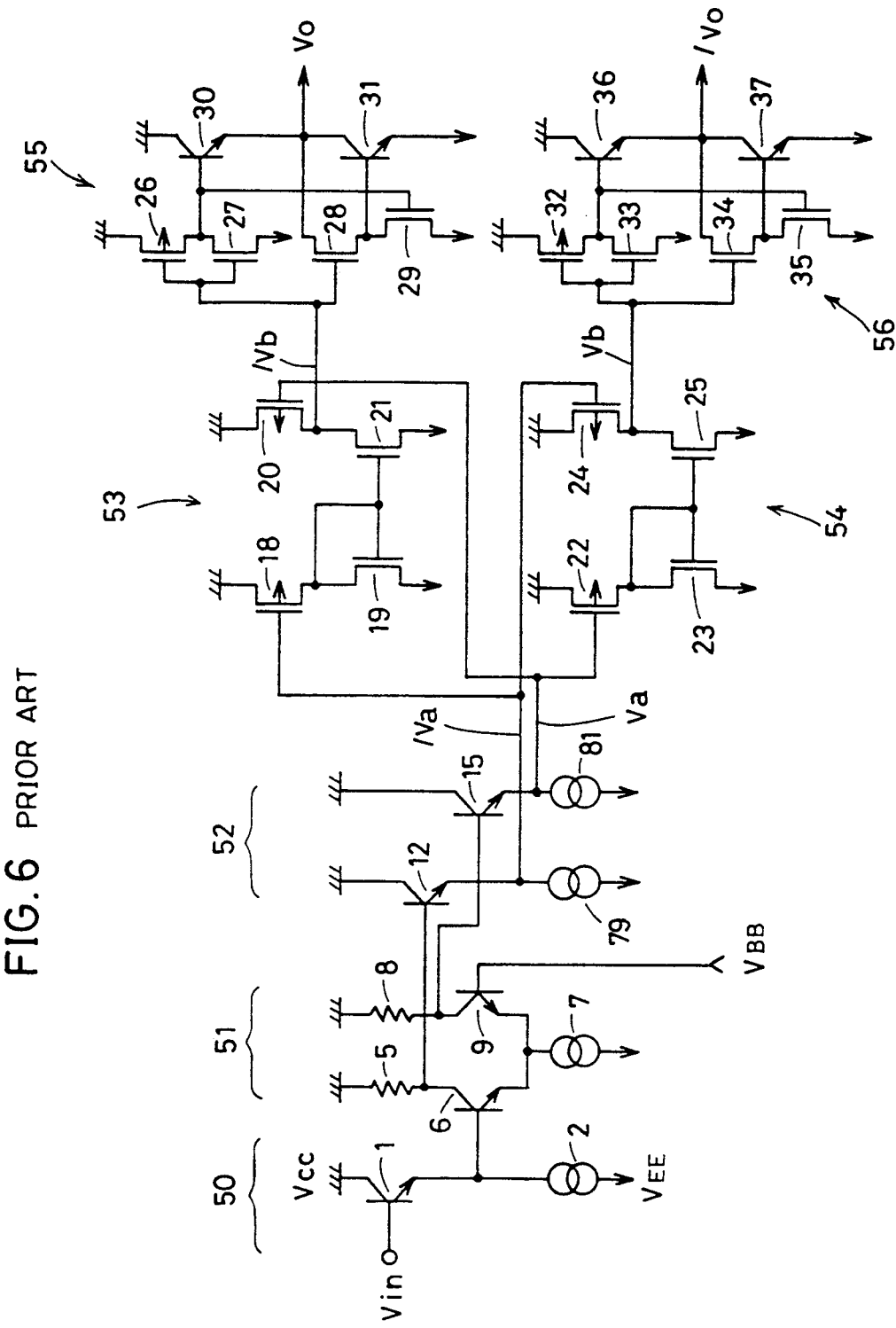
FIG. 6 is a circuit diagram of a conventional input buffer circuit.

More particularly, the base of the npn transistor 4 is connected to the base of the npn transistor 6 as well as to the emitter of the transistor 1. The base of the npn transistor 11 together with the base of the npn transistor 9 are connected to receive the reference potential $V_{BB}$. Transistors 13 and 14 have their gates connected together to a common connection node of the resistor 10 and the transistor 11. Transistors 16 and 17 have their gates connected together to the common connection node of the resistor 3 and the transistor 4. The description of other circuit constructions of the input buffer circuit is not repeated, since the one shown in FIG. 1 is basically the same with the conventional one shown in FIGS. 6 and 7.

The operation will be described. When an input signal Vin changes from a low level to a high level within the range of an ECL logic amplitude, a base potential of each of the transistors 4 and 6 also turn from a low level to a high level. Then, transistors 4 and 6 turn on, and transistors 9 and 11 turn off. Thus, the collector of the transistor 4 is brought to a low level voltage determined by $(VCC - R_3 \cdot I_7/2)$. Similarly, the collector of the transistor 6 is brought to a low level voltage determined by $(VCC - R_5 \cdot I_7/2)$, where, $R_3$ and $R_5$ represent resistance value of resistors 3 and 5, respectively, and $I_7$ represents current value of constant current source 7. The collector of each of the transistors 9 and 11 are brought to a high level almost as high as Vcc. Accordingly, the base of the emitter follower transistor 12 receives a low level voltage, and similarly, the gate of each of the transistors 16 and 17 receives a low level voltage. The base of the emitter follower transistor 5 receives a high level voltage, and the gates of transistors 13 and 14 receive a high level voltage.

Accordingly, since the transistor 13 turns on and the transistor 14 turns off, a signal /Va attains a low level determined by $(VCC - R_5 \cdot I_7/2 - V_{BE12})$. Because the transistor 17 turns on, the signal Va attains a high level voltage almost as high as Vcc. At this time, since a low level voltage is being applied to the gate of the transistor 16, a drain current flowing through the transistor 16 is decreased, so that the current consumption is decreased.

Signals Va and /Va provided from the level shift circuit 59 are applied to current mirror circuits 53 and 54 for converting the levels from the ECL logic amplitude to the CMOS logic amplitude. The description of the operation of current mirror circuits 53 and 54, and driver circuits 55 and 56 is not repeated, since they are the same as the conventional one shown in FIG. 6.

Even when the input signal Vin changes from a high level to a low level within the range of the ECL logic amplitude, it operates in the same manner as above. That is, transistors 4 and 6 turn off, and transistors 9 and 11 turn on. The base of the emitter follower transistor 12 receives a high level voltage, and the gate of each of the transistors 16 and 17 also receive a high level voltage. The base of the emitter follower transistor 5 receives a high level voltage and the gate of each of the transistors 13 and 14 receives a high level voltage.

Accordingly the signal /Va attains a high level almost as high as the Vcc since the transistor 14 turns on. The signal Va attains a low level voltage determined by $(Vcc - R_8 \cdot I_7/2 - V_{BE15})$, where, $R_8$ represents resistance value of the resistor 8, and $V_{BE15}$ represents the base to emitter voltage of the transistor 15. Even in this case, the decrease of the drain current flowing in the transistor 13 decreases current consumption.

A specific advantage of the input buffer circuit shown in FIG. 1 will be described. As shown in FIG. 1, since PMOS transistors 14 and 17 bypassing emitter follower transistors 12 and 15 are provided, signals /Va and Va are pulled up to the voltage value almost as high as the Vcc in a "high" level. Since pulled up signals /Va and Va are applied to current mirror circuits 53 and 54 for level conversion, PMOS transistors 18, 20, 22, and 24 are effectively turned off. Since a penetrating current flowing from ground potential Vcc toward a power supply potential $V_{EE}$ in each of the current mirror circuits 53 and 54 is decreased, current consumption can be decreased.

Figure 7:
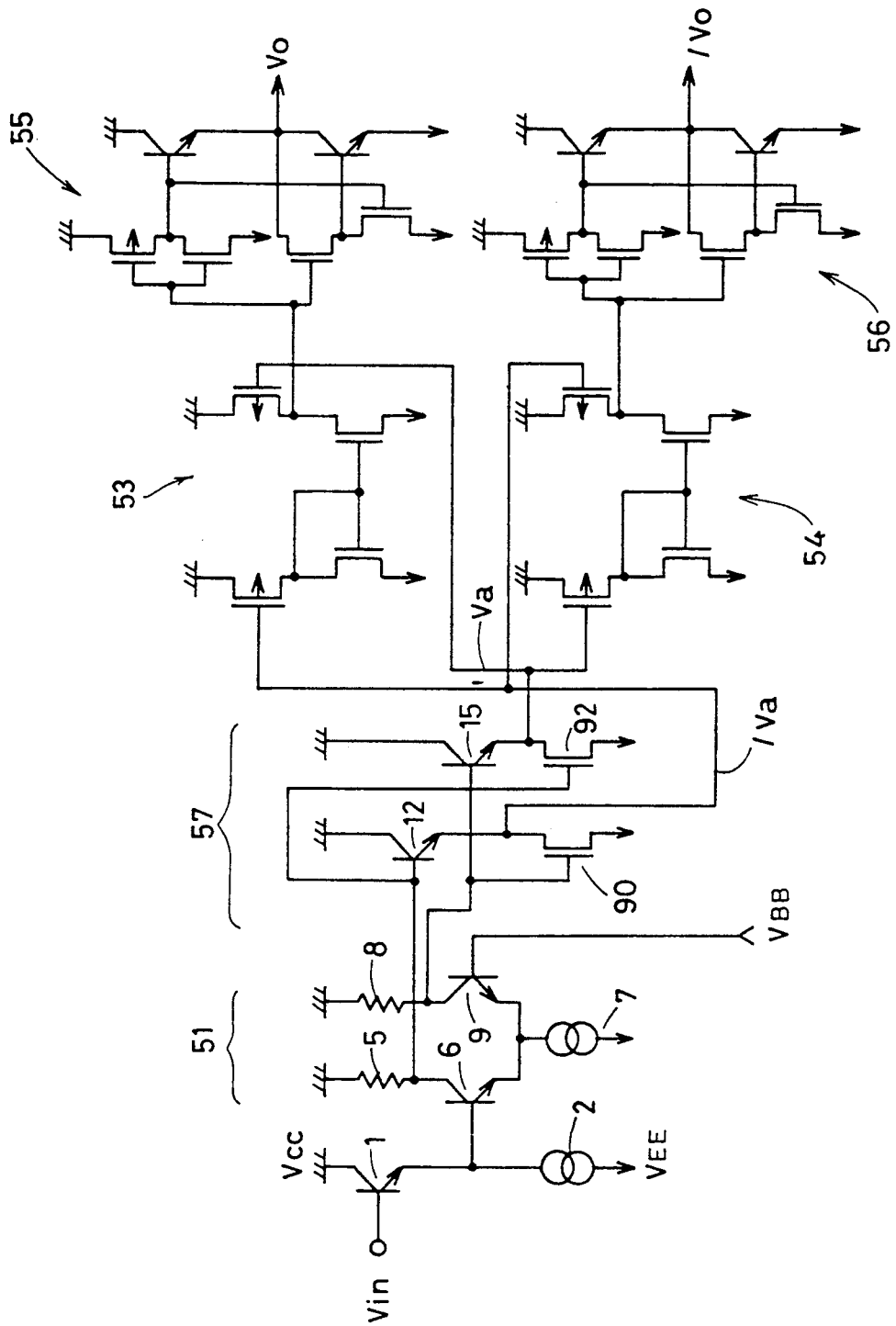
FIG. 7 is a circuit diagram showing another example of the conventional input buffer circuit.

Moreover, the delay produced in the circuit shown in FIG. 7 can be prevented because the gates of MOS transistors are not coupled to the base of the emitter follower transistors 12 and 15, respectively. The reason for this is that the gate of each of the NMOS transistors 13 and 16 operating as controllable current sources is connected to the second differential amplifier circuit. In other words, since transistors 13 and 16 as controllable current sources can be controlled independent from emitter follower transistors 12 and 15, the delay in rise and fall of signals Va and /Va is avoided.

Figure 8:
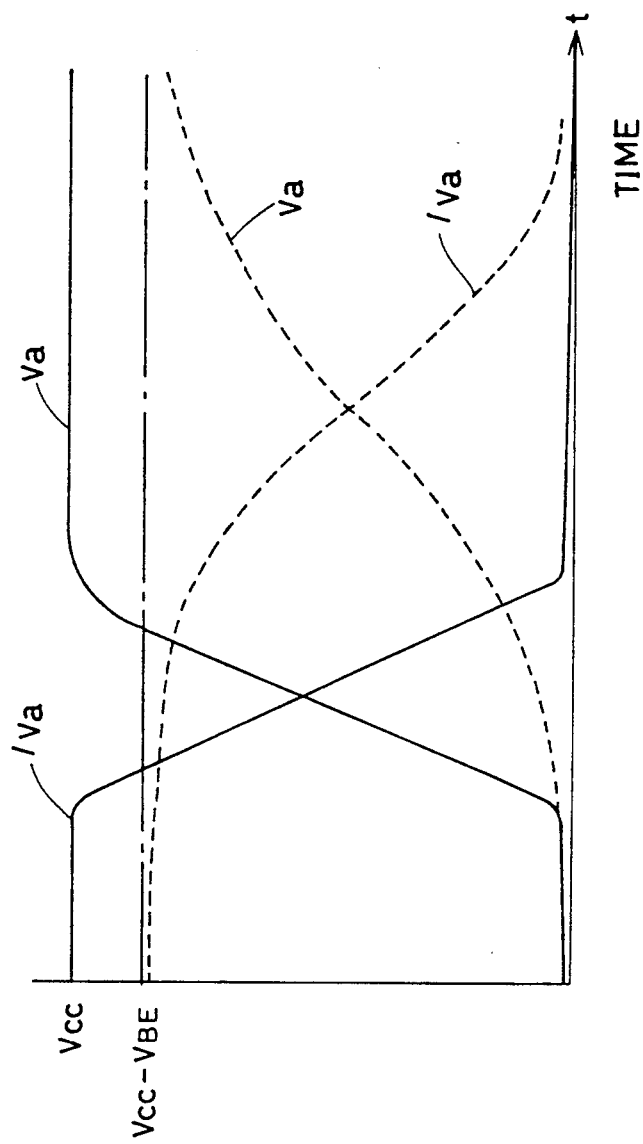
FIG. 8 is a waveform diagram of transition state of an output signal in a level shift circuit.

The advantage mentioned above is shown further in FIG. 8. As shown by the solid line in FIG. 8, signals Va and /Va rise and fall more rapidly than signals Va and /Va in the conventional circuit shown by the dotted line. In addition, it is indicated that the voltage value of signals Va and /Va in a high level of the improved circuit shown in FIG. 1 reaches almost Vcc.

Figure 2:
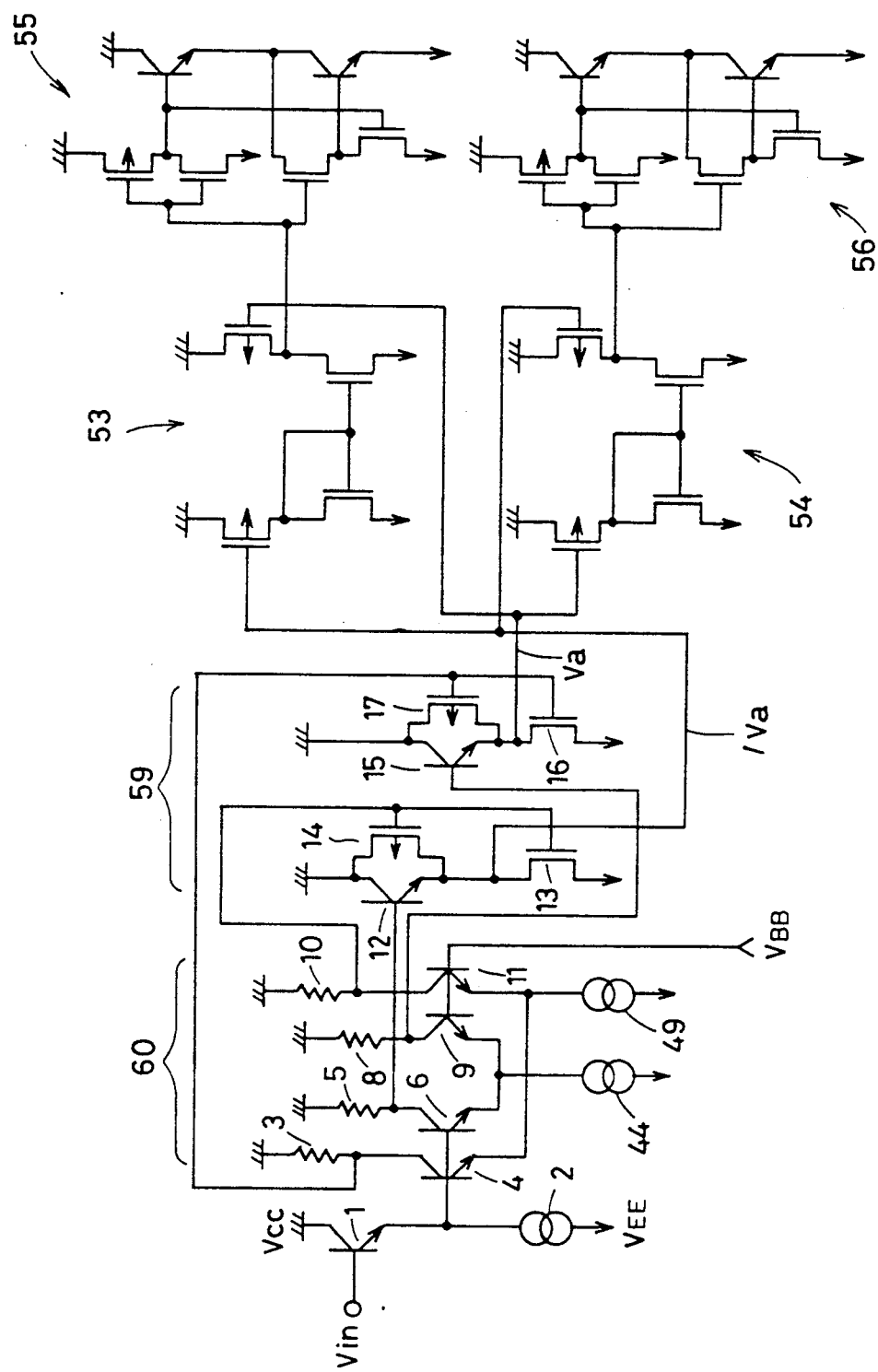
FIG. 2 is a circuit diagram of the input buffer circuit showing another embodiment of the present invention.

FIG. 2 is a circuit diagram of an input buffer circuit showing another embodiment of the present invention. In the input buffer circuit shown in FIG. 1, first and second differential amplifier circuit utilize a single constant current source 7 together, but the input buffer circuit shown in FIG. 2 comprises two constant current sources 44 and 49 for respective differential amplifier circuits. That is, the constant current source 44 is connected between an emitter of each of npn transistors 6 and 9 and a power supply potential $V_{EE}$ Similarly, the constant current source 49 is connected between the emitter of each of npn transistors 4 and 11 and the power supply potential $V_{EE}$. As it is recognized from the foregoing description, the output current of the constant current source 44 is set high in order to operate emitter follower transistors 12 and 15 at high speed. The constant current source 49 for controlling transistors 13 and 16 as the controllable current sources does not require such a high output current. In other words, since output current value of constant current sources 44 and 49 can be separately and appropriately controlled, high speed operation is achieved under less current consumption than the circuit shown in FIG. 1.

Figure 3:
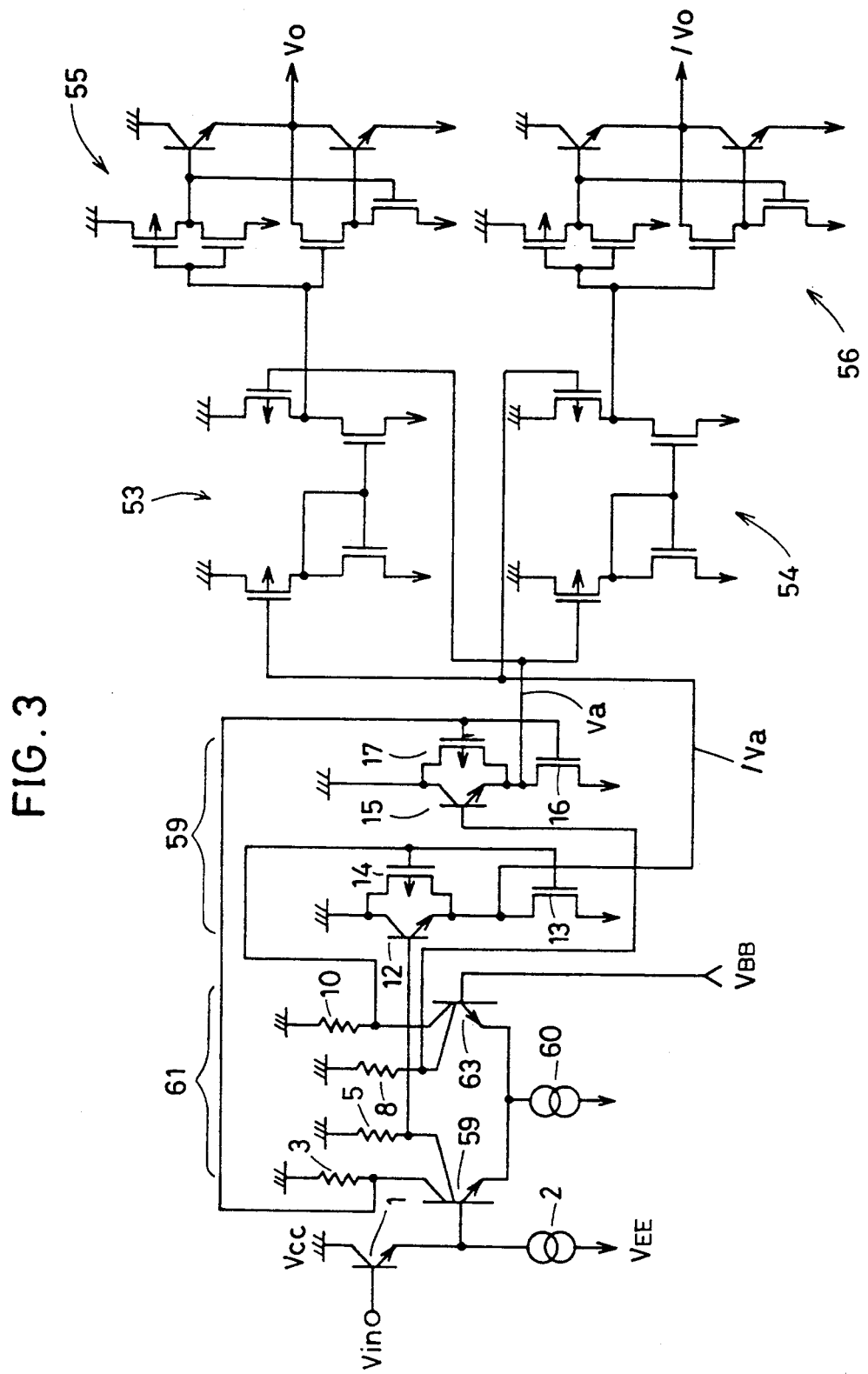
FIG. 3 is a circuit diagram of the input buffer circuit showing yet another embodiment of the present invention.

FIG. 3 is a circuit diagram of an input buffer circuit showing yet another embodiment of the present invention. In the circuit shown in FIG. 3, two multicollector transistors 59 and 63 are provided in place of four npn transistors 4, 6, 9, and 11 shown in FIG. 1. Therefore, the occupied area of the input buffer circuit can the circuit shown in FIG. 1.

Figure 4:
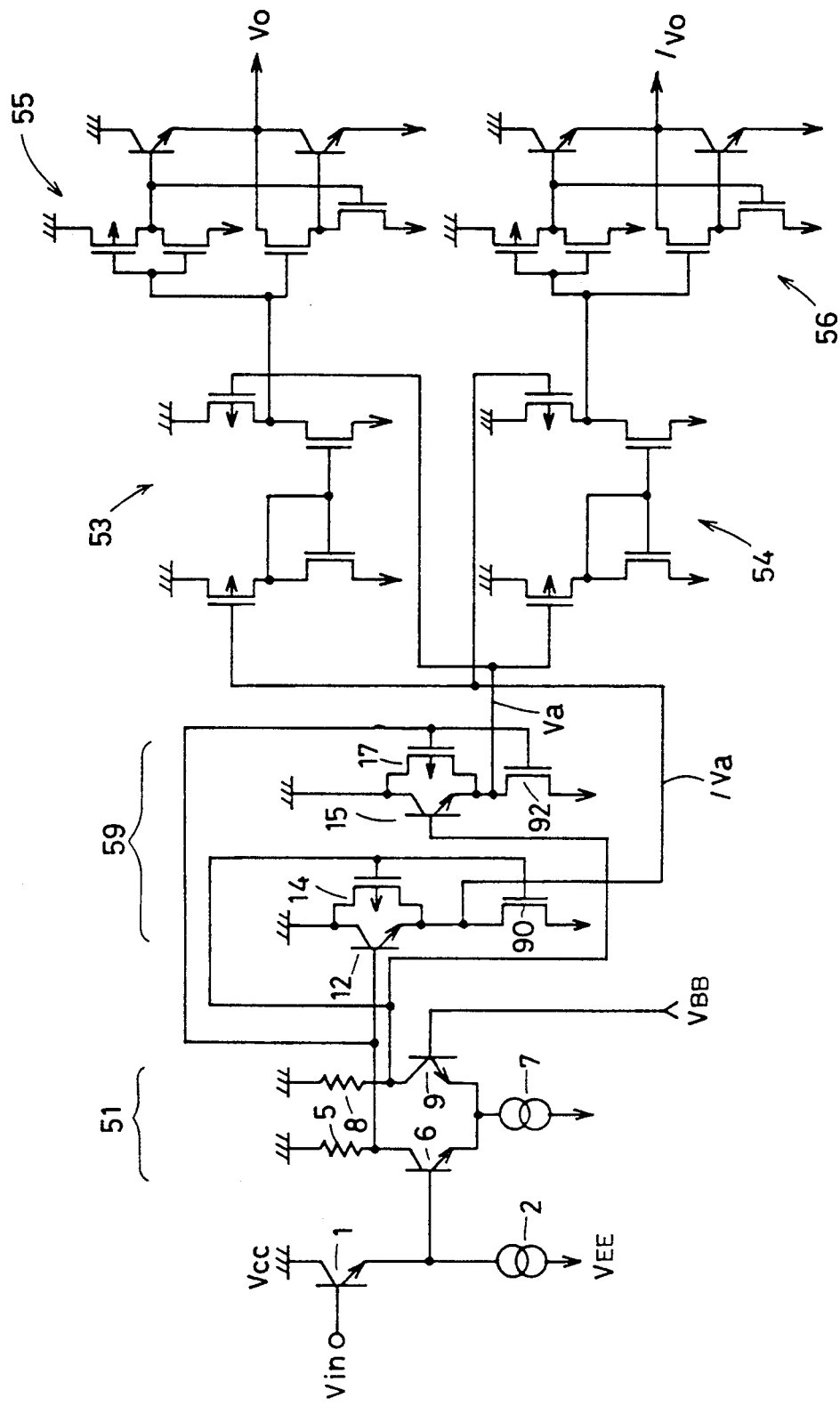
FIG. 4 is a circuit diagram of the input buffer circuit showing yet another embodiment of the present invention.

FIG. 4 is a circuit diagram of an input buffer circuit showing still another embodiment of the present invention. When compared with the conventional one shown in FIG. 7, only PMOS transistors 14 and 17 for bypassing npn transistors 12 and 15 are added to the one in FIG. 4. The gates of the transistors 14 and 17 are connected to the collector of npn transistors 9 and 6, respectively. In the input buffer circuit shown in FIG. 4, the problem of the operation delay in transistors 12 and 15 remains, but since transistors 14 and 17 pull up signals /Va and Va, a penetrating current in current mirror circuits 53 and 54 is decreased.

In the embodiments shown in FIGS. 1 to 4, the level converting circuit using current mirror circuits 53 and 54 and BiCMOS driver circuits 55 and 56 are utilized, however, it is noted by identified to those skilled in the art that other level converting circuits and driver circuits may be used.

As mentioned above, input buffer circuits shown in FIGS. 1, 2, and 3 comprise additional differential amplifier circuit to control PMOS transistors 14 and 17 bypassing emitter follower transistors 12 and 15, and NMOS transistors 13 and 16 comprising controllable current sources. The level shift circuit 59 can operate more rapidly because the gate capacitances of the MOS transistors are not connected to the base of emitter follower transistors 12 and 15, respectively. In addition, since bypass transistors 14 and 17 pull up signals/Va and Va, the penetrating current flowing in current mirror circuits 53 and 54 is decreased. Thus, current consumption is decreased.

Figure 5:
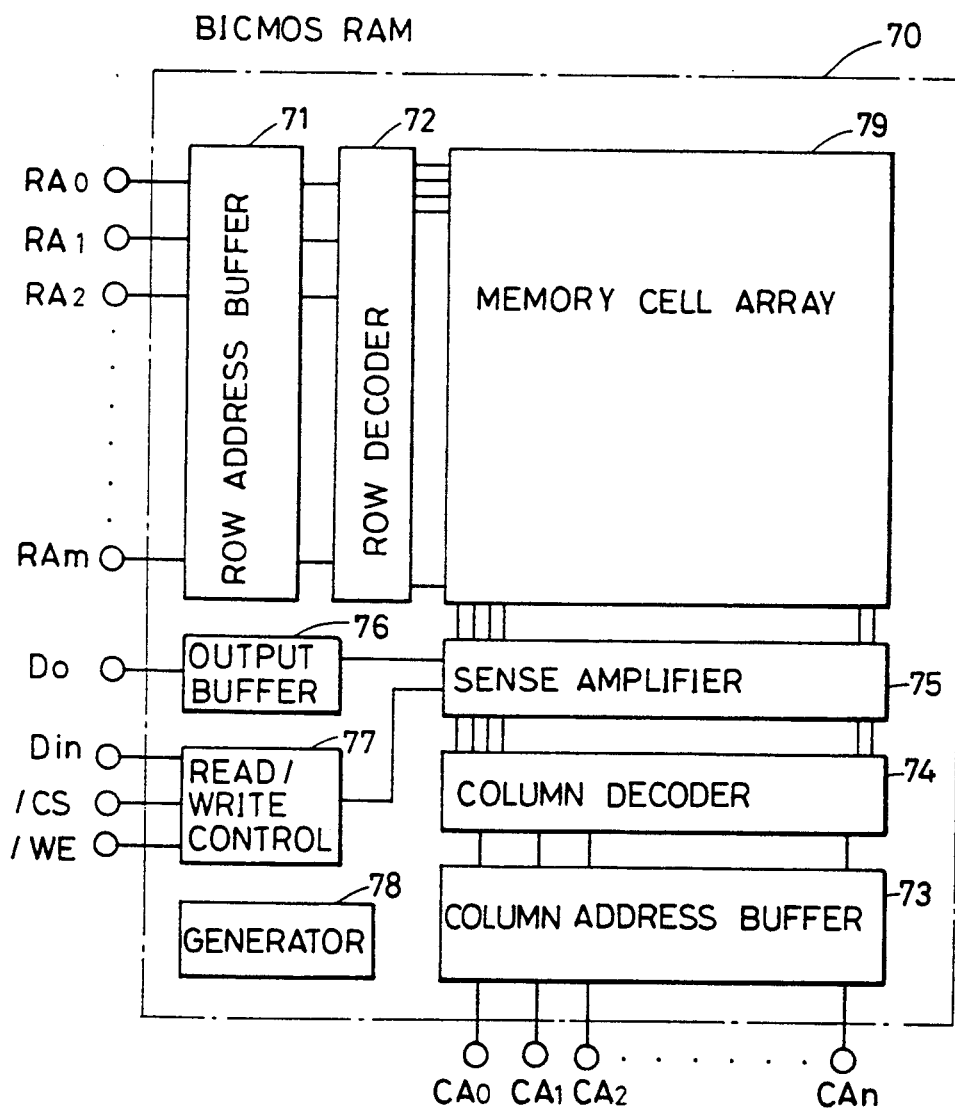
FIG. 5 is a block diagram of a BiCMOS RAM.

Input buffer circuits shown in FIGS. 1 to 4 are applicable for example, in address buffers 71 and 73 in a BiCMOS RAM shown in FIG. 5, but it should be noted that these circuits are applicable not only to the BiCMOS RAM, but generally, to the BiCMOS integrated circuit.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An input buffer circuit for a semiconductor integrated circuit device comprising:
    first and second differential amplifier means, each operated in response to an applied input signal and a predetermined differential potential; and
    emitter follower level shift means for level shifting the output signal provided from said first differential amplifier means;
    wherein said emitter follower level shift means includes;
    a bipolar transistor and a controllable current source connected in series between first and second power supply potentials,
    said bipolar transistor having a base connected to receive the output signal provided from said first differential amplifier means, and
    said controllable current source being operated in response to an output signal provided from said second differential amplifier means.

2. The input buffer circuit according to claim 1, wherein said emitter follower level shift means further comprises bypass means for bypassing said bipolar transistor in response to the output signal provided from said second differential amplifier means.

3. An input buffer circuit for a BiCMOS integrated circuit device operated in response to an input signal having an ECL logic amplitude comprising:
    first and second differential amplifier means, each operated in response to a difference between an input signal and a predetermined reference potential,
    said first and second differential amplifier means generating complementary first and second output signals, respectively;
    first emitter follower level shift means for level shifting a first output signal generated from said first differential amplifier means; and
    second emitter follower level shift means for level shifting a second output signal generated from said first differential amplifier means;
    wherein said first emitter follower level shift means includes;
    a first bipolar transistor and a controllable current source connected in series between first and second power supply potentials,
    said first bipolar transistor having a base connected to receive the first output signal provided from said first differential amplifier means, and
    said first controllable current source being operated in response to the first output signal provided from said second differential amplifier means, and
    first bypass means for bypassing said first bipolar transistor in response to the first output signal provided from said first differential amplifier means,
    and wherein said second emitter follower level shift means includes;
    a second bipolar transistor and a second controllable current source connected in series between said first and second power supply potentials,
    said second bipolar transistor having a base connected to receive the second output signal provided from said second differential amplifier means,
    said second controllable current source being operated in response to the second output signal provided from said second differential amplifier means, and
    second bypass means for bypassing said second bipolar transistor in response to the second output signal provided from said second differential amplifier means.

* * * * *